(12) United States Patent
Okada

(10) Patent No.: US 6,891,904 B1
(45) Date of Patent: May 10, 2005

(54) MODULATION SIGNAL ANALYSIS APPARATUS

(75) Inventor: Tomohisa Okada, Kanagawa (JP)

(73) Assignee: Anritsu Corporation, Tokyo (JP)

( * ) Notice: Subject to any disclaimer, the term of this patent is extended or adjusted under 35 U.S.C. 154(b) by 792 days.

(21) Appl. No.: 09/868,490
(22) PCT Filed: Nov. 8, 2000
(86) PCT No.: PCT/JP00/07842
§ 371 (c)(1),
(2), (4) Date: Jun. 18, 2001
(87) PCT Pub. No.: WO01/37502
PCT Pub. Date: May 25, 2001

(30) Foreign Application Priority Data

Nov. 12, 1999 (JP) ............................................ 11/322466

(51) Int. Cl.[7] .......................... H03K 9/00; H04L 27/06; H04L 27/14; H04L 27/22
(52) U.S. Cl. ....................... 375/316; 375/224; 375/298; 324/76.23; 324/76.27; 331/4; 331/49
(58) Field of Search ................................ 375/224, 298; 324/76.23, 76.27; 331/4, 49

(56) References Cited

U.S. PATENT DOCUMENTS 6,112,067 A * 8/2000 Seike et al. .............. 455/226.4
6,243,576 B1 * 6/2001 Seike et al. ................... 455/423
6,509,728 B1 * 1/2003 Uchino et al. ............ 324/76.15

FOREIGN PATENT DOCUMENTS

| JP | 5-80053 | 10/1993 |
| JP | 6-217230 | 8/1994 |
| JP | 9-257843 | 10/1997 |

* cited by examiner

Primary Examiner—Mohammed Ghayour
Assistant Examiner—Juan Torres
(74) Attorney, Agent, or Firm—Frishauf, Holtz, Goodman & Chick, P.C.

(57) ABSTRACT

An analysis operation section uses a digital signal converted by an A/D converter, and performs frequency analysis for a modulation signal and modulation analysis for the modulation signal selected by a signal selection circuit in order to modulate/analyze a digital signal level of the modulation signal as an analysis object outputted from a level converter. A controller instructs the analysis operation section to execute an analysis instruction inputted via an operation input section, sends a selection instruction to the signal selection circuit in accordance with a modulation type of the inputted modulation signal, and sets a bandwidth of an RBW filter in accordance with the modulation type when the modulation signal having a band limited by the RBW filter is selected as the modulation signal inputted to the A/D converter, and the modulation analysis instruction is inputted.

10 Claims, 4 Drawing Sheets

MODULATION SIGNAL ANALYSIS APPARATUS

This application is a U.S. National Phase Application under 35 USC 371 of International Application PCT/JP00/07842 (not published in English) filed Nov. 8, 2000.

TECHNICAL FIELD

The present invention relates to a modulation signal analysis apparatus, particularly to a modulation signal analysis apparatus for analyzing various modulation signals for use in various communication systems including a mobile communication system.

BACKGROUND ART

In general, mobile communication systems are well known throughout the world, such as various types of cellular phone and car phone, as well as the simple Japanese personal handyphone system (PHS).

In these mobile communication systems, it is very important to measure/analyze the various properties of a modulation signal transmitted/received between a base station and a mobile station (portable terminal), and thereby confirm that the properties are in an allowable range of a predetermined standard.

The measurement/analysis of the modulation signal is roughly divided into frequency analysis and modulation analysis.

First, for the frequency analysis, an occupied frequency range of the modulation signal, transmission power in each frequency, adjacent channel leak power, spurious property, and the like are analyzed.

Moreover, modulation analysis differs with the type of modulation system, however, the items which are analyzed are the modulation factor, modulation precision, and the like.

FIG. 2 shows a constitution of a conventional modulation signal analysis apparatus in which the frequency analysis and modulation analysis can be performed with respect to the modulation signal in this manner.

That is, as shown in FIG. 2, a modulation signal a inputted via an input terminal 1 is inputted to a multiplier (mixer) 2a of a frequency sweeper 2.

A sweep frequency signal b is applied to the multiplier 2a from a sweep oscillator 2b.

Moreover, the modulation signal outputted from the frequency sweeper 2 is limited in band by a band pass filter (BPF) 3, and subsequently inputted to a multiplier (mixer) 4a of a frequency converter 4.

A local oscillation signal is applied to the multiplier 4a from a local oscillator 4b.

Therefore, the frequency converter 4 converts a center frequency $f_C$ of the modulation signal outputted from the BPF 3 to an intermediate frequency $f_I$.

Moreover, a modulation signal $a_1$ having the center frequency $f_C$ converted to the intermediate frequency $f_I$ by the frequency converter 4 is inputted to a resolution bandwidth (RBW) filter 5.

Here, as shown in the frequency characteristics diagram of FIG. 6, the RBW filter 5 is controlled with a bandwidth (resolution bandwidth) RBW determined by a resolution in which a frequency component in the modulation signal as an analysis object is set.

The resolution bandwidth RBW is set centering on the center frequency $f_C$ equal to the intermediate frequency $f_I$ of the frequency converter 4.

After the frequency component is limited in several bands by the RBW filter 5, the modulation signal $a_1$ is subjected to logarithm conversion by a logarithm (LOG) converter 6, and a level signal d of a decibel (dB) unit with the frequency on a time axis (abscissa) is obtained.

The level signal d outputted from the LOG converter 6 is inputted to a video bandwidth (VBW) filter 7.

The VBW filter 7 removes noise included in the level signal d with the frequency on the time axis (abscissa).

Moreover, the level signal d whose noise is removed by the VBW filter 7 is converted to a digital level signal $d_1$ by an analog/digital (A/D) converter 8, and subsequently inputted to a changeover section 9.

On the other hand, the modulation signal $a_1$ whose center frequency $f_C$ is converted to the intermediate frequency $f_I$ by the frequency converter 4, that is, the modulation signal $a_1$ before the frequency component is limited in several bands by the RBW filter 5 is converted to a digital modulation signal $a_2$ by an A/D converter 11, and subsequently inputted to the changeover section 9.

The changeover section 9 transmits one signal designated by a controller 10 out of the inputted level signal $d_1$ and modulation signal $a_2$ to a waveform memory 11.

The waveform memory 11 stores/retains the inputted level signal $d_1$ or the modulation signal $a_2$.

Moreover, when the digital level signal $d_1$ is stored in the waveform memory 11, an analysis operation section 12 uses the digital level signal $d_1$ to perform frequency analysis.

Furthermore, when the digital modulation signal $a_2$ is stored in the waveform memory 11, the analysis operation section 12 uses the digital modulation signal $a_2$ to perform modulation analysis.

Therefore, a transmission power property calculator 13a, adjacent channel leak power calculator 13b, spurious property calculator 13c, and the like for performing the frequency analysis are disposed in the analysis operation section 12.

Furthermore, a modulation factor calculator 14a, modulation precision calculator 14b, and the like for performing the modulation analysis are disposed in the analysis operation section 12.

Property calculation results in the respective calculators 13a, 13b, 13c, 14a, 14b of the analysis operation section 12 are displayed in a display 15.

Moreover, an operation input section 16 has a function of inputting the aforementioned various measurement items and measurement conditions to the controller 10 by a measuring person (operator).

Furthermore, the controller 10 switches/controls the changeover section 9 in accordance with the measurement (analysis) items inputted via the operation input section 16, and additionally controls a sweep operation of the frequency sweeper 2.

Additionally, the controller 10 selects and starts the respective operators 13a, 13b, 13c, 14a, 14b of the analysis operation section 12.

Moreover, if necessary, the controller 10 changes a bandwidth RBW of the RBW filter 5.

In the modulation signal analysis apparatus constituted in this manner, the pass bandwidth (resolution bandwidth) RBW shown in FIG. 6 in the RBW filter 5 indicates a frequency resolution in a case in which the modulation signal is subjected to the frequency analysis as shown in FIGS. 3A, 3B.

Here, FIG. 3A shows a waveform of the level signal d before being inputted to the VBW filter 7.

Moreover, FIG. 3B shows the waveform of the level signal d before being output from the VBW filter 7.

The VBW filter 7 removes high-frequency noise included in the level signal d in this manner.

FIG. 4A shows transmission power levels of respective channels (n−1), n, (n+1) obtained by the transmission power property calculator 13a of the analysis operation section 12, and leak powers to adjacent channels of the respective channels (n−1), n, (n+1) obtained by the adjacent channel leak power calculator 13b of the analysis operation section 12.

Moreover, FIG. 4B shows a spurious property obtained by the spurious property calculator 13c of the analysis operation section 12.

FIG. 5 shows the modulation precision obtained by the modulation precision calculator 14b of the analysis operation section 12.

In an example shown in FIG. 5, a π/4 quadrature phase shift keying (QPSK) modulation signal is used as the object of analysis of the modulation signal.

In this case, an amplitude error ($A_S$−A) and phase error $α(=θ_S−θ)$ of an amplitude A and phase θ of a symbol position P measured in an in-phase component (I)/orthogonal component (Q) coordinate system from an amplitude $A_S$ and phase $θ_S$ of a reference symbol position $P_S$ are obtained.

As shown in FIGS. 4A and 4B, in order to subject the inputted modulation signal a to frequency analysis, it is necessary to convert the modulation signal $a_1$ to the level signal d with the frequency on the time axis (abscissa).

On the other hand, as shown in FIG. 5, in order to subject the inputted modulation signal a to modulation analysis, it is necessary to directly analyze the waveform of the modulation signal $a_1$ and calculate base band signal components I, Q included in the modulation signal $a_1$. Therefore, the modulation signal $a_1$ before conversion to the level signal d needs to be used.

Moreover, in order to perform modulation analysis, respective signal levels (amplitudes) in respective frequencies in the bandwidth in the modulation signal $a_1$ are preferably substantially constant.

Therefore, when frequency analysis is performed on the inputted modulation signal a, the measuring person (operator) operates the operation input section 16 and selects the digital level signal $d_1$ by the changeover section 9.

Moreover, when the modulation analysis is performed on the inputted modulation signal a, the measuring person (operator) operates the operation input section 16, selects the digital modulation signal $a_2$ by the changeover section 9, and additionally stops a sweep operation of the frequency sweeper 2.

When simple signal changeover means is disposed in this manner, frequency analysis and modulation analysis can be performed with respect to the inputted modulation signal a with one modulation signal analysis apparatus.

However, there is the following problem yet to be solved even in the modulation signal analysis apparatus shown in FIG. 2.

That is, depending upon the modulation system of the modulation signal a as the analysis object, the modulation signal a subjected to multi-channel multiplexing has a predetermined bandwidth centering on the center frequency $f_C$ (=intermediate frequency $f_I$).

Therefore, when modulation analysis is performed on the modulation signal a, and excessive band limitation is performed on the modulation signal a, respective base band signals I, Q cannot be correctly demodulated from the modulation signal. Therefore, the modulation precision cannot be correctly measured as shown in FIG. 5.

In order to prevent such situations occurring, in the conventional art, after the modulation signal $a_1$ with the center frequency $f_C$ outputted from the frequency converter 4 and fixed to the intermediate frequency $f_I$ is subjected to the band limitation with a fixed bandwidth, modulation analysis is performed.

However, for example, in mobile communication systems such as cellular phones, various modulation systems are developed for the modulation system of the modulation signal transmitted/received between the base station and each mobile station (portable terminal), and some of the systems are implemented.

The bandwidth (BW) used largely differs with the respective modulation systems.

For example, as shown in FIG. 6, the bandwidth (BW) used in general personal digital cellular (PDC) phones in Japan is 30 kHz.

Moreover, the bandwidth in the aforementioned PHS and global system for mobile communication (GMS) in Europe is 300 kHz.

Furthermore, the bandwidth in a code division multiple access (CDMA) using a spectrum diffusion system to rapidly increase the number of channels included in one modulation signal is 1.5 MHz, and the bandwidths in W-CDMA are 4 MHz, 8 MHz, 16 MHz, . . . .

In this manner, the bandwidth (BW) for use in the CDMA and W-CDMA using the spectrum diffusion system to rapidly increase the number of channels included in one modulation signal rapidly increases.

Therefore, the bandwidth for performing pass band control on the modulation signal cannot univocally be determined.

Moreover, when a filter for exclusive use in performing the modulation analysis is disposed, the manufacture cost of the modulation signal analysis apparatus is much increased.

BRIEF SUMMARY OF THE INVENTION

The present invention has been developed in consideration of the aforementioned situation, and an object thereof. Is to provide modulation signal analysis apparatus in which an RBW filter is selectively used for modulation analysis in accordance with a modulation type of a modulation signal as an analysis object, and thereby frequency analysis and modulation analysis can be performed on various types of modulation signals with a high precision by a simple constitution.

According to one aspect of the present invention, there is provided a modulation signal analysis apparatus comprising:

a frequency converter (4) for converting a frequency of a modulation signal (a) inputted from the outside to an intermediate frequency;

an RBW filter (5) for receiving the modulation signal outputted from the frequency converter and limiting a frequency component with a bandwidth determined by a designated resolution;

a level converter (6) for converting the modulation signal having a band limited by the RBW filter to a digital level signal (d) to perform frequency analysis;

a signal selection circuit (17) for selecting either one modulation signal from the modulation signal (a1) before having the band limited by the RBW filter and the modulation signal (a3) having the band limited by the RBW filter;

an A/D converter (11) for receiving the modulation signal selected by the signal selection circuit and converting the modulation signal to a digital signal;

an operation input section (19) for operating/inputting a frequency analysis instruction for the modulation signal, a modulation analysis instruction for the modulation signal, and a modulation type of the modulation signal;

an analysis operation section (12) for using the digital signal converted by the A/D converter and performing frequency analysis for the modulation signal and modulation analysis for the modulation signal selected by the signal selection circuit in order to modulate/analyze a level signal outputted from the level converter; and a controller (18) for instructing the analysis operation section to execute the analysis instruction operated/inputted via the operation input section, sending a selection instruction to the signal selection circuit in accordance with the modulation type of the operated/inputted modulation signal, and setting the bandwidth of the RBW filter in accordance with the modulation type of the modulation signal when the modulation signal having the band limited by the RBW filter is selected as the modulation signal inputted to the A/D converter, and the modulation analysis instruction for the modulation signal is inputted to the operation input section.

In the modulation signal analysis apparatus constituted in this manner, a measuring person (operator) designates whether frequency analysis or modulation analysis is performed by the operation input section.

Here, when modulation analysis is designated, the type of modulation signal is further operated/inputted.

Then, the modulation signal having the band limited by the RBW filter or the modulation signal having the band not limited by the RBW filter is automatically selected as the modulation signal inputted to the analysis operation section in accordance with the modulation type of the modulation signal.

For example, the modulation signal before being input to the RBW filter is selected with respect to the modulation type of the modulation signal with a broad bandwidth such as CDMA.

Moreover, the modulation signal outputted from the RBW filter is selected with respect to the modulation type of the modulation signal with a narrow bandwidth such as PDC.

Therefore, for the modulation signal with a narrow bandwidth, such as PDC, high-frequency and low-frequency noise components widely deviating from the bandwidth are removed, and modulation analysis precision is enhanced.

On the other hand, for a modulation signal with a broad bandwidth such as CDMA, since modulation analysis is performed in a broad bandwidth state, the modulation analysis precision is enhanced.

DETAILED DESCRIPTION OF THE INVENTION

One embodiment of the present invention will be described hereinafter with reference to the drawings.

Figure 1:
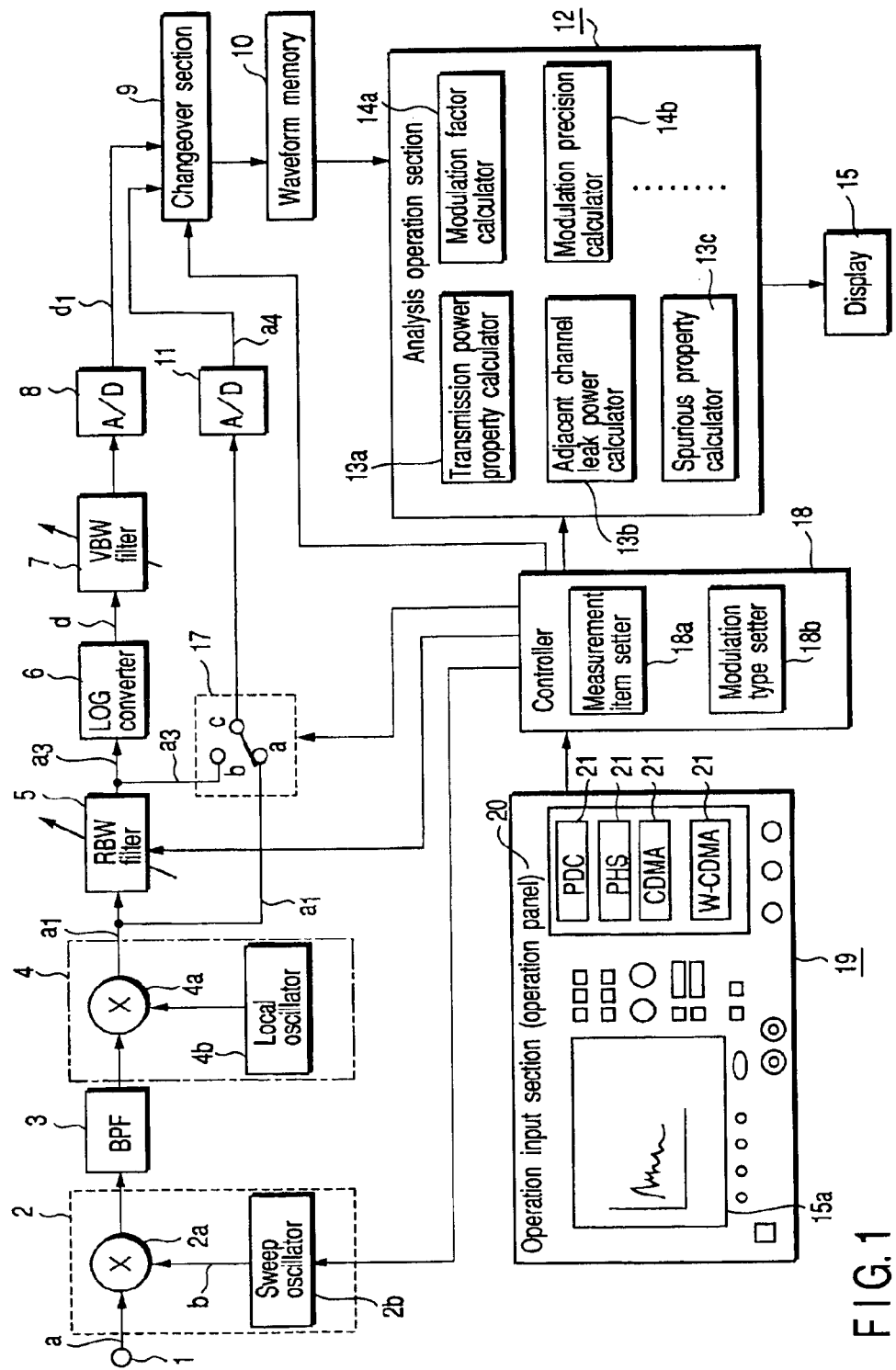
FIG. 1 is a block diagram showing a schematic constitution of a modulation signal analysis apparatus according to one embodiment of the present invention.

FIG. 1 is a block diagram showing a schematic constitution of a modulation signal analysis apparatus according to one embodiment of the present invention.

Figure 2:
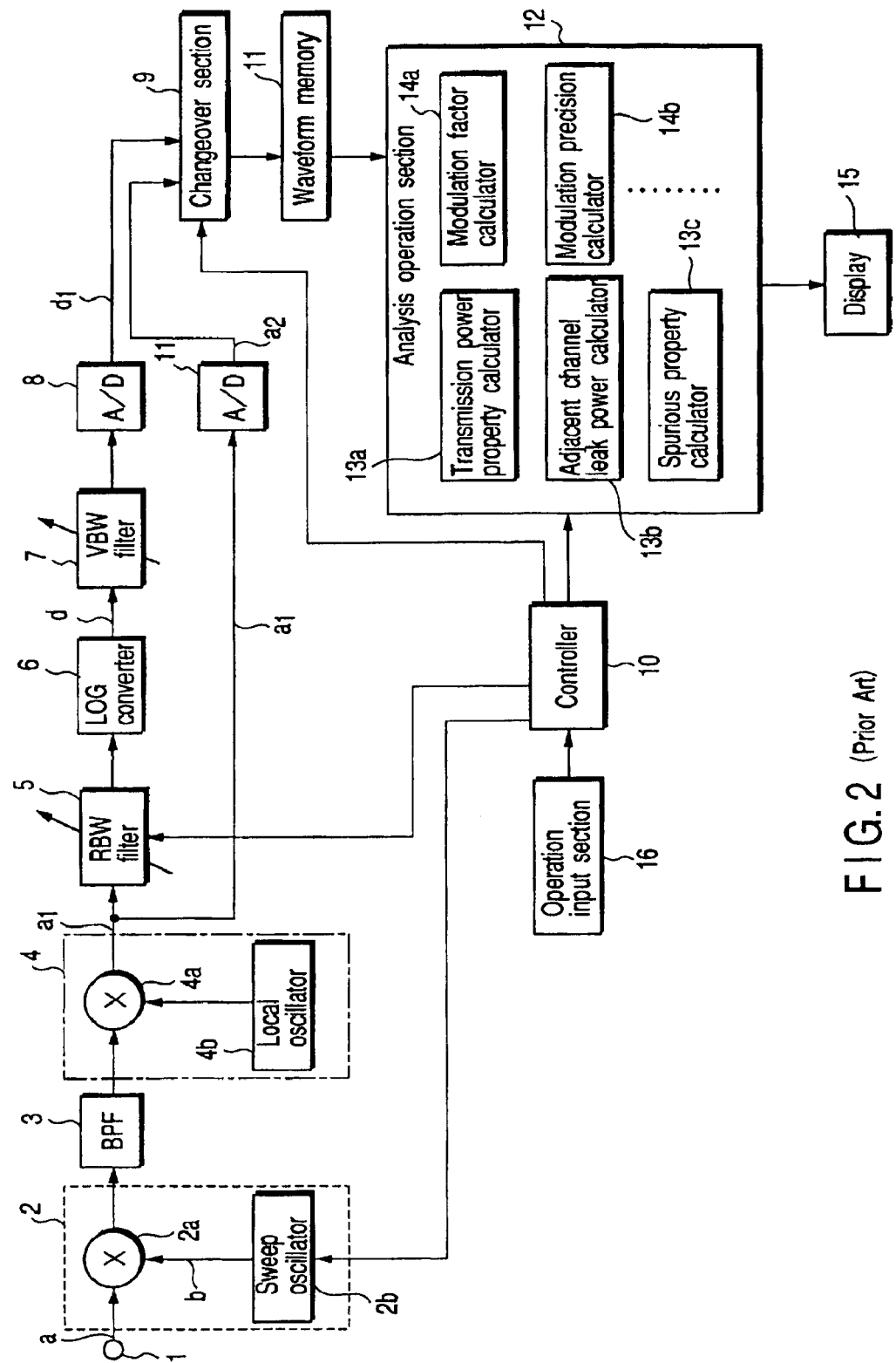
FIG. 2 is a block diagram showing the schematic constitution of a conventional modulation signal analysis apparatus.
Figures 3A, 3B:
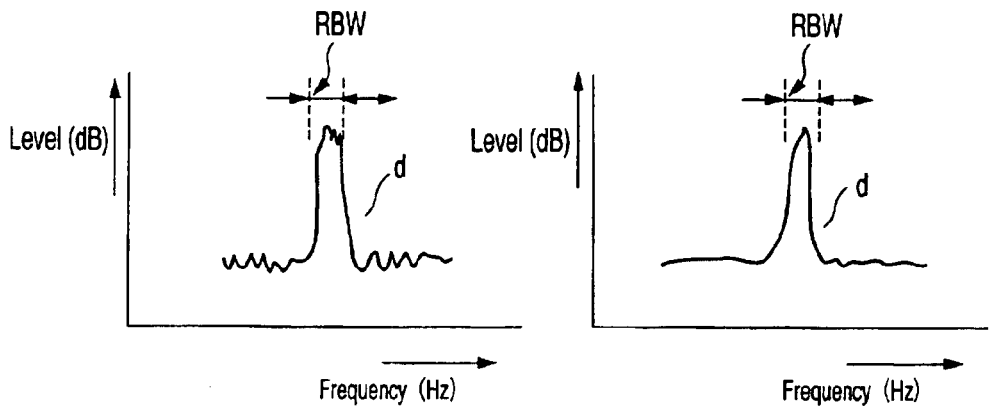
FIGS. 3A, 3B are diagrams showing a signal waveform of a level signal outputted from a LOG converter in the modulation signal analysis apparatus of FIG. 2.
Figures 4A, 4B:
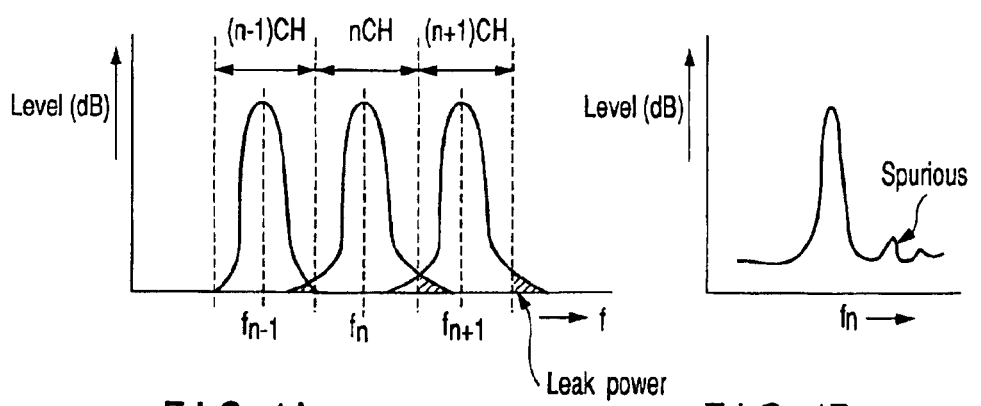
FIGS. 4A, 4B are diagrams showing transmission power and spurious properties measured by the modulation signal analysis apparatus of FIG. 2.
Figure 5:
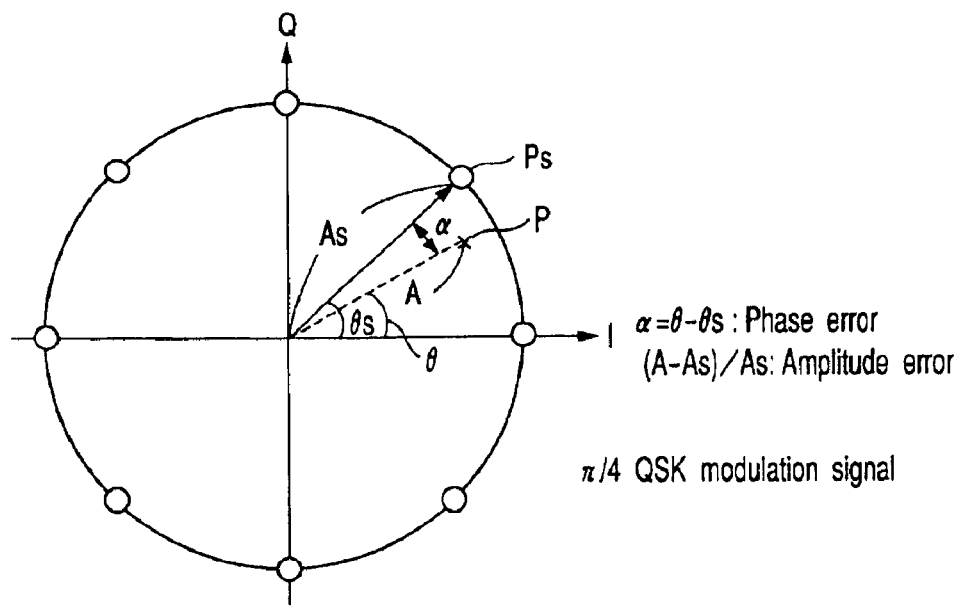
FIG. 5 is a diagram showing modulation precision measured by the modulation signal analysis apparatus of FIG. 2.
Figure 6:
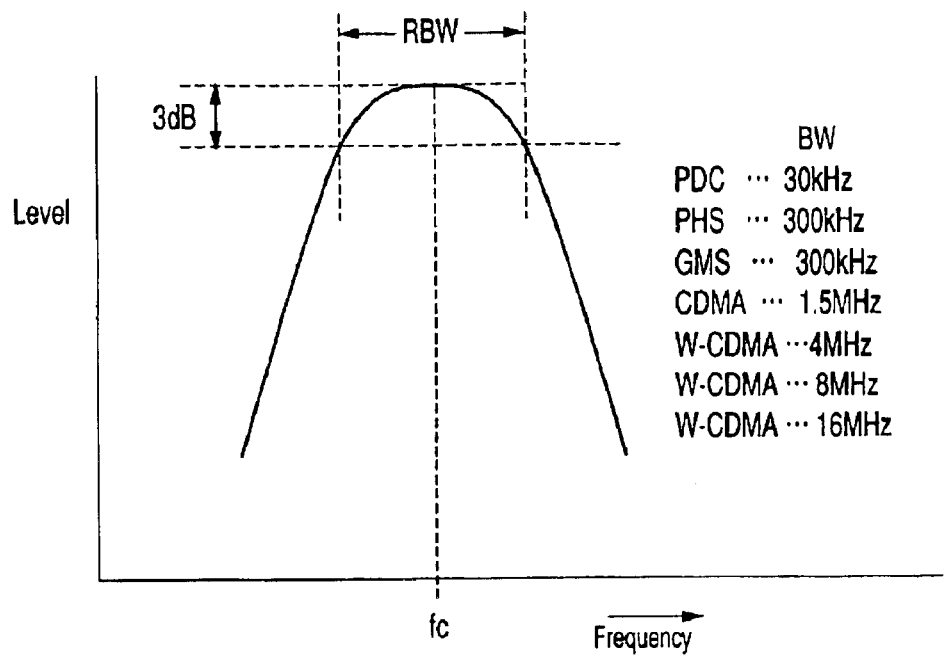
FIG. 6 is a diagram showing frequency properties of an RBW filter incorporated in the modulation signal analysis apparatus of FIG. 2.

In FIG. 1, the same elements as those of the conventional modulation signal analysis apparatus shown in FIG. 2 are denoted by the same reference numerals, and a detailed description of the overlapping sections is omitted.

In the modulation signal analysis apparatus according to one embodiment of the present invention, a modulation signal $a_1$ in which a center frequency $f_C$ outputted from a frequency converter 4 is set to an intermediate frequency $f_I$ of the frequency converter 4 is inputted to an RBW filter 5, and additionally to one input terminal a of a signal selection circuit 17.

Moreover, a modulation signal $a_3$ whose bandwidth is limited to RBW by the RBW filter 5 is inputted to the other input terminal b of the signal selection circuit 17.

The signal selection circuit 17 switches/connects a common terminal c to either one of input terminals a, b to which the modulation signals $a_1$, $a_3$ are inputted based on a selection instruction from a controller 18.

Either one of the modulation signals $a_1$, $a_3$ outputted via the common terminal c of the signal selection circuit 17 is converted to a digital modulation signal $a_4$ by an A/D converter 11 and inputted to one input terminal of a changeover section 9.

Similarly as FIG. 1, a digital level signal $d_1$ is inputted to the other input terminal of the changeover section 9 while the frequency outputted from an A/D converter 8 is on a time axis (abscissa).

The changeover section 9 switches the digital modulation signal $a_4$ or the digital level signal $d_1$ to be written in a waveform memory 10 based on a switch instruction from the controller 18.

Moreover, similarly as in FIG. 1, a frequency sweeper 2, frequency converter 4, and LOG converter 6 constitute a conversion circuit in which the modulation signal $a_3$ passed through the RBW filter 5 is LOG converted and converted to a level signal d with the frequency on the time axis (abscissa) to perform frequency analysis.

Moreover, similarly as in FIG. 1, a transmission power property calculator 13a, adjacent channel leak power calculator 13b, spurious property calculator 13c, and the like for performing the frequency analysis are disposed in the analysis operation section 12.

Furthermore, a modulation factor calculator 14a, modulation precision calculator 14b, and the like for performing the modulation analysis are disposed in the analysis operation section 12.

Property calculation results in the respective calculators 13a, 13b, 13c, 14a, 14b of the analysis operation section 12 are displayed in a display 15.

In an operation input section 19 constituting a part of an operation panel, a multiplicity of measurement item buttons 20 of a transmission power measurement, adjacent channel leak power measurement, spurious measurement, modulation factor measurement, modulation precision measurement, and the like, and a plurality of modulation type buttons 21 of PDC, PHS, CDMA, W-CDMA, and the like are disposed.

Furthermore, a display screen 15a of the display is exposed in the operation panel.

The operation input section 19 transmits a measurement item designated with the measurement item button 20 and a modulation type designated with the modulation type button 21 by the measuring person (operator) to the controller 18.

Here, a measurement item setter 18a and modulation type setter 18b are disposed in the controller 18.

In this case, the modulation type setter 18b transmits a selection instruction of the modulation signal $a_3$ to the signal selection circuit 17 when the modulation type with a narrow use bandwidth such as PDC and PHS is inputted from the operation input section 19.

As a result, the modulation signal $a_3$ outputted from the RBW filter 5 is converted to the digital modulation signal $a_4$ by the A/D converter 11 and inputted to the changeover section 9.

Moreover, the modulation type setter 18b transmits the selection instruction of the modulation signal $a_1$ to the signal selection circuit 17 when the modulation type with a broad use bandwidth such as CDMA and W-CDMA is inputted from the operation input section 19.

As a result, the modulation signal $a_1$ before inputted to the RBW filter 5 is converted to the digital modulation signal $a_4$ by the A/D converter 11 and inputted to the changeover section 9.

Furthermore, the modulation type setter 18b sets a predesignated RBW to the RBW filter 5 with respect to the modulation type designated from the operation input section 19.

Moreover, the measurement item setter 18a switches/controls the changeover section 9 to change an input for the waveform memory 10 to the side of the digital level signal $d_1$, and sends a start instruction to the frequency sweeper 2 when the respective measurement items such as the transmission power measurement, adjacent channel leak power measurement, and spurious measurement for the frequency analysis are inputted from the operation input section 19.

Subsequently, the measurement item setter 18a sends an execution instruction of the calculator corresponding to the measurement item to the analysis operation section 12.

Moreover, the measurement item setter 18a switches/controls the changeover section 9 to change the input for the waveform memory 10 to the side of the digital modulation signal $a_4$, and sends an operation stop instruction to the frequency sweeper 2 when the respective measurement items such as the modulation factor measurement and modulation precision measurement for the modulation analysis are inputted from the operation input section 19.

Subsequently, the measurement item setter 18a sends the execution instruction of the calculator corresponding to the measurement item to the analysis operation section 12.

In the modulation signal analysis apparatus constituted in this manner, when various measurements are performed in response to the modulation signal a inputted via the input terminal 1, the measuring person (operator) selects the measurement item with the measurement item button 20, and the modulation type with the modulation type button 21 from the operation input section 19.

Then, the controller 18 automatically sets optimum measurement conditions from the selected measurement item and modulation type.

To be specific, when the measurement item is a measurement item belonging to frequency analysis, the level signal $d_1$ with the frequency taken via the changeover section 9 on the time axis is used to perform frequency analysis corresponding to the selected measurement item in the analysis operation section 12, and an analysis result is displayed/outputted to the display 15.

Moreover, when the measurement item is a measurement item belonging to the modulation analysis, the digital modulation signal $a_4$ taken via the changeover section 9 is used to perform frequency analysis corresponding to the selected measurement item in the analysis operation section 12, and the analysis result is displayed/outputted to the display 15.

Furthermore, when the modulation type is PDC, PHS, or the like with a narrow use bandwidth, the modulation signal $a_3$ with the band controlled by the RBW filter 5 is A/D converted and the digital modulation signal $a_4$ is used.

Therefore, in this case, since high-frequency and low-frequency noise components deviating far from the bandwidth in the modulation signal a are removed, modulation analysis precision is enhanced.

Moreover, when the modulation type is CDMA, W-CDMA, or the like with a broad use bandwidth, the modulation signal $a_1$ before subjected to band control by the RBW filter 5 is A/D converted and the digital modulation signal $a_4$ is used.

Therefore, in this case, since modulation analysis is performed with the broad bandwidth in the modulation signal a, the modulation analysis precision is enhanced.

Furthermore, when modulation analyses such as the modulation factor measurement and modulation precision measurement are performed, the RBW filter 5 already incorporated in the modulation signal analysis apparatus is selectively used in accordance with the modulation type of the modulation signal as the analysis object.

Therefore, the manufacture cost does not largely rise when compared to the conventional modulation signal analysis apparatus shown in FIG. 2.

As described above, in the modulation signal analysis apparatus of the present invention, when the modulation analysis such as the modulation factor measurement and modulation precision measurement are performed, band limitation is performed with the RBW filter before the modulation analysis in accordance with the modulation type of the modulation signal as the analysis object.

Therefore, according to the present invention, a modulation signal analysis apparatus can be provided which can perform highly accurate frequency analysis and modulation analysis for various types of modulation signals, using a simple construction.

What is claimed is:

1. A modulation signal analysis apparatus comprising:
   a frequency converter for converting a frequency of a modulation signal inputted from outside to an intermediate frequency;
   a resolution bandwidth (RAW) filter for receiving the modulation signal outputted from said frequency converter and limiting a frequency component with a bandwidth determined by a designated resolution;

a level converter for converting the modulation signal having a band limited by said RBW filter to a digital level signal to perform frequency analysis;

a signal selection circuit for selecting either one modulation signal from the modulation signal before having the band limited by said RBW filter or the modulation signal after having the band limited by said RBW filter;

an A/D converter for receiving the modulation signal selected by said signal selection circuit and converting the modulation signal to a digital signal;

an operation input section for operating and inputting outside a frequency analysis instruction for said modulation signal, a modulation analysis instruction for said modulation signal, and a modulation type of said modulation signal;

an analysis operation section for using the digital signal converted by said A/D converter and performing frequency analysis for said modulation signal and modulation analysis for the modulation signal selected by the signal selection circuit in order to modulate and analyze a level signal outputted from said level converter; and a controller for instructing said analysis operation section to execute the analysis instruction operated and inputted via said operation input section, sending a selection instruction to said signal selection circuit in accordance with the modulation type of the operated and inputted modulation signal, and setting the bandwidth of said RBW filter in accordance with the modulation type of said modulation signal when the modulation signal having the band limited by said RBW filter is selected as the modulation signal inputted to said A/D converter, and the modulation analysis instruction for said modulation signal is inputted to said operation input section.

2. The modulation signal analysis apparatus according to claim 1, wherein said controller sends the selection instruction of the modulation signal having the band limited by said RBW filter to said signal selection circuit when the modulation type with a narrow use bandwidth is inputted from said operation input section.

3. The modulation signal analysis apparatus according to claim 1, wherein said controller sends the selection instruction of the modulation signal before subjected to the band limitation by said RBW filter to said signal selection circuit when the modulation type with a broad use bandwidth is inputted from said operation input section.

4. The modulation signal analysis apparatus according to claim 2, wherein a Personal Digital Cellular (PDC) or Personal Handyphone System (PHS) signal is inputted as the modulation type with the narrow use bandwidth to said controller from said operation input section.

5. The modulation signal analysis apparatus according to claim 3, wherein a Code Division Multiple Access (CDMA) or Wideband Code Division Multiple Access (W-CDMA) signal is inputted as the modulation type with the broad use bandwidth to said controller from said operation input section.

6. The modulation signal analysis apparatus according to claim 1, wherein said controller comprises:

a modulation type setting section for sending the selection instruction to said signal selection circuit in accordance with the modulation type inputted from said operation input section; and a measurement item setting section for sending an execution instruction for calculating a property corresponding to a measurement item to said analysis operation section when the measurement item is inputted from said operation input section.

7. The modulation signal analysis apparatus according to claim 1, wherein said operation input section comprises:

a measurement item selection button for selecting a desired measurement item when a desired measurement is executed in response to said modulation signal inputted from the outside; and a modulation type selection button for selecting the modulation type of said modulation signal inputted from the outside.

8. The modulation signal analysis apparatus according to claim 7, wherein said modulation type selection button comprises:

a PDC selection button;

a PHS selection button;

a CDMA selection button; and a W-CDMA selection button.

9. The modulation signal analysis apparatus according to claim 1, wherein said analysis operation section comprises:

a transmission power property calculator;

an adjacent channel teak power calculator; and a spurious property calculator for performing frequency analysis.

10. The modulation signal analysis apparatus according to claim 1, wherein said analysis operation section comprises:

a modulation factor calculator; and a modulation precision calculator for performing the modulation analysis.

* * * * *